(12) United States Patent
Hwang

(10) Patent No.: US 11,038,501 B2
(45) Date of Patent: Jun. 15, 2021

(54) TRANSISTOR CIRCUIT AND ELECTRONIC CIRCUIT HAVING SAME

(71) Applicant: DB HiTek Co., Ltd., Seoul (KR)

(72) Inventor: Tae-Ho Hwang, Uijeongbu-si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/859,693

(22) Filed: Apr. 27, 2020

(65) Prior Publication Data

US 2020/0343886 A1 Oct. 29, 2020

(51) Int. Cl.
*H03L 5/00* (2006.01)
*H03K 5/08* (2006.01)
*H03K 17/16* (2006.01)
*H03K 17/30* (2006.01)

(52) U.S. Cl.
CPC ......... *H03K 17/161* (2013.01); *H03K 17/302* (2013.01)

(58) Field of Classification Search
CPC .......................... H03K 17/161; H03K 17/302
USPC ....................................................... 327/317
See application file for complete search history.

(56) References Cited

U.S. PATENT DOCUMENTS 5,148,054 A * 9/1992 Demler ................ H03K 5/249
327/379

FOREIGN PATENT DOCUMENTS

KR 20100074499 A * 7/2010
KR 10-2018-0094855 A 8/2018

* cited by examiner

*Primary Examiner* — Metasebia T Retebo
(74) *Attorney, Agent, or Firm* — Andrew D. Fortney; Central California IP Group, P.C.

(57) ABSTRACT

A transistor circuit having a dummy capacitor or a dummy transistor between an input terminal and a transistor is disclosed. The circuit improves secondary nonlinear characteristics of the transistor attributable to one or more parasitic components and a clock signal. The transistor circuit includes an input terminal configured to receive an input signal, a transistor having a gate configured to receive a clock signal, and a source connected to the input terminal, a connection line between the input terminal and the transistor and having a parasitic resistor therein, a parasitic capacitor between the input terminal and the transistor, and a dummy transistor having a first terminal that is connected to the connection line between the input terminal and the transistor.

4 Claims, 4 Drawing Sheets

TRANSISTOR CIRCUIT AND ELECTRONIC CIRCUIT HAVING SAME

CROSS REFERENCE TO RELATED APPLICATION

The present application claims priority to Korean Patent Application No. 10-2019-0049633, filed Apr. 29, 2019, the entire contents of which are incorporated herein for all purposes by this reference.

BACKGROUND OF THE INVENTION

1. Field of the Invention

The present invention relates to a transistor circuit. More particularly, the present invention relates to a transistor circuit having improved secondary nonlinearity.

2. Description of the Related Art

Transistor circuits are commonly used in various devices, such as amplifiers, mixers, filters, and oscillators. When nonlinearity occurs in a transistor circuit, the output signal may be distorted. That is, an NMOS or PMOS transistor serving as a switch in a transistor circuit may suffer clock feedthrough due to parasitic components in the circuit when the circuit receives a clock signal. When clock feedthrough occurs, the transistor circuit exhibits nonlinear characteristics, which results in distortion in the output signal.

Referring to FIG. 1, a conventional transmission gate including an NMOS/PMOS transistor has been used to solve this problem. Alternatively, a dummy NMOS/PMOS transistor has been used to prevent the nonlinearity.

However, in the related art, since only a sampling capacitor is taken into account in designing the transmission gate or the dummy NMOS/PMOS transistor, the effect of nonlinearity cannot be completely eliminated.

That is, referring to FIG. 2, in a conventional transistor circuit according to the related art, a secondary nonlinearity occurs due to a parasitic resistance $R_P$ in a signal path through which an input signal $V_{IN}$ is transferred. That is, a first parasitic current $I_G$ is induced in the signal path by a clock signal $V_{CK}$ and a parasitic capacitor $C_{GP}$, and a charge on an output capacitor $C_H$ is affected by charge from an output current $I_{TR}$ ($I_{TR}=I_G-I_R$) from the transistor. This contributes to an error voltage in an output signal $V_{OUT}$. That is, when a switch is opened (i.e., the transistor is turned off), the transistor remains on until the clock signal $V_{CK}$ reaches or decreases below a threshold voltage $V_{TH}$. Accordingly, secondary nonlinearity occurs during this period.

SUMMARY OF THE INVENTION

The present invention has been made in view of the problems occurring in the related art, and one objective of the present invention is to provide a transistor circuit having a dummy capacitor or a dummy transistor between an input terminal and the transistor to reduce secondary nonlinearity that occurs in the transistor due to a parasitic component and a clock signal.

The objective(s) of the present invention can be achieved by embodiments described below.

According to various embodiments of the present invention there is provided relate to a transistor circuit including an input terminal configured to receive an input signal, a transistor having a gate configured to receive a clock signal and a source connected to the input terminal, a connection line including a parasitic resistor between the source of the transistor and the input terminal, a parasitic capacitor between (i) the input terminal or the connection line and (ii) the transistor or a signal line providing the clock signal, and a dummy capacitor with a first terminal connected to the connection line that is between the input terminal and the transistor.

According to further embodiments of the present invention, the transistor circuit may further include an output line connected to a drain of the transistor and an output capacitor connected to the output line.

According to even further embodiments of the present invention, the transistor circuit may be configured such that the connection line is connected to the source of the transistor, and/or the dummy capacitor has a second terminal connected to a ground terminal or a connection line that is between the input terminal and a second terminal of the parasitic capacitor.

According to yet further embodiments of the present invention, the transistor circuit may be configured such that, when the input signal is applied to the input terminal and the clock signal (e.g., a normal clock signal) is input to the transistor, the dummy capacitor may reduce a first parasitic current through the parasitic resistor and an output current through the transistor.

According to yet further embodiments of the present invention, there is provided a transistor including an input terminal configured to receive an input signal, a transistor having a gate configured to receive a clock signal, a connection line including a parasitic resistor between the input terminal and the transistor, a first parasitic capacitor between (i) the input terminal and/or the connection line and (ii) the transistor or a signal line providing the clock signal, a dummy transistor having a gate configured to receive an inverted clock signal that is complementary to the clock signal, the dummy transistor being connected to the input terminal and the transistor, a second parasitic capacitor connected to the input terminal and the dummy transistor, and a third parasitic capacitor connected to the second parasitic capacitor and the dummy transistor.

According to various embodiments of the present invention, the transistor circuit may further include an output line connected to a drain of the transistor and an output capacitor connected to the output line.

According to various embodiments of the present invention, the dummy transistor has a source connected to the input terminal and a drain connected to a source of the transistor.

According to various embodiments of the present invention, the transistor circuit may be configured such that a first terminal of the second parasitic capacitor is connected to connection line that connects the input terminal and the source of the dummy transistor, and a second terminal of the second parasitic capacitor is connected to the gate of the dummy transistor or a signal line providing the inverted clock signal.

According to various embodiments of the present invention, the transistor circuit may be configured such that a first terminal of the third parasitic capacitor is connected to a connection line that is connected to a source of the transistor and a drain of the dummy transistor, and a second terminal of the third parasitic capacitor is connected to the gate of the dummy transistor or the signal line providing the inverted clock signal.

According to various embodiments of the present invention, the transistor circuit may be configured such that when the input signal is applied to the input terminal and an inverted clock signal is applied to the dummy transistor, a second parasitic current flows through the second parasitic capacitor and the third parasitic capacitor, thereby reducing a first parasitic current that flows through the first parasitic capacitor.

According to various embodiments of the present invention, there is provided an electronic circuit including a transistor circuit serving as a switch, the transistor circuit including an input terminal configured to receive an input signal, a transistor having a gate configured to receive a clock signal and a source connected to the input terminal, a connection line including a parasitic resistor between the input terminal and the transistor, a parasitic capacitor coupled to an input signal line, and a dummy capacitor having a first terminal connected to the connection line between the input terminal and the transistor.

According to other embodiments of the present invention, in the electronic circuit including the transistor circuit, the transistor circuit may further include an output line connected to a drain of the transistor and an output capacitor connected to the output line.

According to various embodiments of the present invention, in the electronic circuit including the transistor circuit, the connection line is connected between the input terminal and a source of the transistor, a first terminal of the dummy capacitor is connected to the connection line, and a second terminal of the dummy capacitor is connected to a ground terminal or a connection line between the input terminal and a second terminal of the parasitic capacitor.

According to various embodiments of the present invention, there is provided an electronic circuit including a transistor circuit serving as a switch, the transistor circuit including an input terminal configured to receive an input signal, a transistor having a gate configured to receive a clock signal, a connection line including a parasitic resistor between the input terminal and the transistor, a first parasitic capacitor between the input terminal and the transistor, a dummy transistor having a gate configured to receive an inverted clock signal, the dummy transistor being between the input terminal and the transistor, and a second parasitic capacitor between the input terminal and the dummy transistor.

According to various embodiments of the preset invention, in the electronic circuit including the transistor circuit, the transistor circuit may further include a third parasitic capacitor between the transistor and the dummy transistor, having a first terminal that may be connected to a connection line between a source of the transistor and a drain of the dummy transistor.

According to various embodiments of the present invention, in the electronic circuit including the transistor circuit, the first terminal of the third parasitic capacitor may be connected to the gate of the dummy transistor.

With the structures described above, the transistor circuits according to various embodiments of the present invention have advantages described below.

Since the transistor circuit includes a capacitor or a dummy transistor between the input terminal and the transistor, it is possible to reduce the effect of a parasitic component in a signal line (e.g., connected to an output of the transistor).

In addition, since the transistor circuit includes the capacitor or the dummy transistor between the input terminal and the transistor, it is possible to reduce an effect of transistor secondary nonlinearity induced by parasitic components and clock signals.

In addition, when the transistor circuit is used in switched-capacitor circuits that are commonly found in analog circuits, it is possible to improve the performance of such switched-capacitor circuits. In addition, when the transistor circuit is used in products such as a sensor including multiple channels and multiple IC chips, it is possible to reduce a performance difference between the channels and a performance difference between the IC chips.

In addition, when the transistor circuit is used in products such as a sensor using multiple channels and multiple IC chips, it is not necessary to use layout techniques such as a clock tree that is used to equalize the parasitic components in respective signal lines when designing such a product (e.g., the sensor). Therefore, the transistor circuit can be used in various circuits.

Although some effects are not mentioned above, when those effects and the potential effects thereof are anticipated to be obtained by the detailed technical features of the present invention which will be described below, it is noted that those effects and the potential effects are regarded to be described herein.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
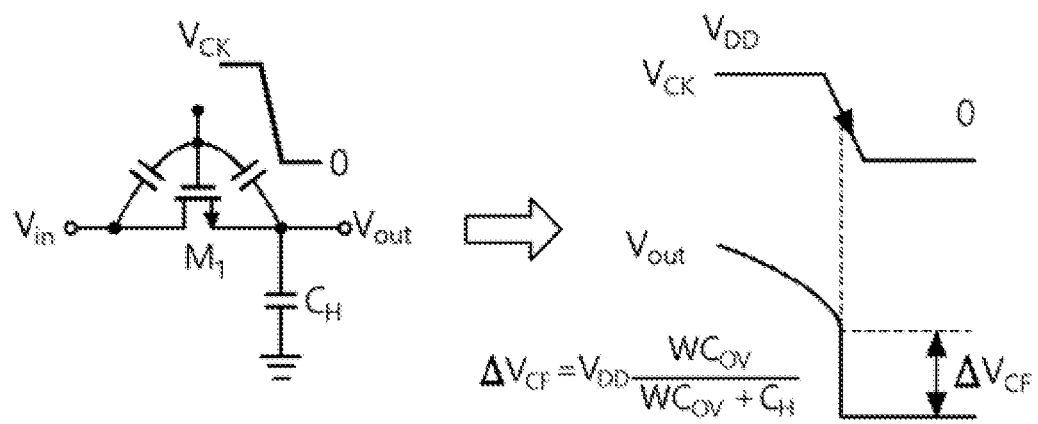
FIGS. 1 and 2 are diagrams illustrating transistor circuits in the related art.
Figure 2:
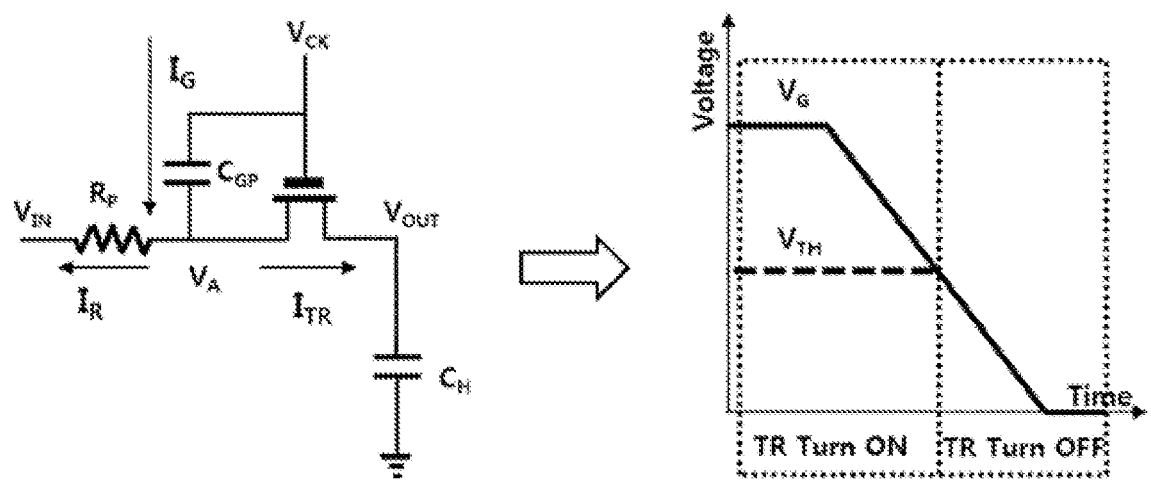

Hereinafter, with reference to the accompanying drawings, various embodiments of the present invention will be described in detail, so that those skilled in the art to which the present invention pertains can easily implement the technical spirit of the present invention. As to reference numerals attached to the components of each drawing, it should be noted that the same components are denoted by the same reference numerals as much as possible throughout the drawings. In addition, in describing the present invention, when it is determined that detailed descriptions of known configurations or function of related arts may obscure the subject matter of the present invention, the detailed descriptions will be omitted.

Transistor circuits according to embodiments of the present invention can be used in various devices, such as an amplifier, a mixer, a filter, and an oscillator.

Herein, the term "transistor circuit" refers to a circuit that includes a transistor working as a switch. A transistor in a transistor circuit has gate-source and gate-drain parasitic capacitances.

When a voltage on the gate swings due to a clock signal that is input to the gate of the transistor in the transistor circuit, clock feedthrough (e.g., a change in the amount of charge on the transistor source or drain) due to the parasitic component(s) (e.g., capacitance[s]) the transistor occurs.

Specifically, when the transistor serving as a switch is turned off, a significant error voltage appears in the output signal of the transistor due to nonlinearity.

When the switch (i.e., transistor) is turned off, ideally, the source and the drain of the transistor are perfectly isolated from each other, and an expected voltage (i.e., the correct voltage) occurs as an output signal. However, an error voltage may be introduced due to parasitic components (e.g., capacitances), resulting in nonlinearity, which contributes to the distortion in the output signal.

Generally, in the transistor circuit, when a clock signal is input, a first parasitic current flows through a parasitic resistor, and a second parasitic current flows through a parasitic capacitor; an amount of charge corresponding to a difference between the first parasitic current and the second parasitic current may be introduced to an output capacitor through the transistor that remains on. This reduces the charge sampled or stored on the output capacitor, resulting in an error voltage in the output signal. That is, the output signal of the transistor circuit changes due to the parasitic resistance $R_P$.

In addition, in conventional transistor circuits, secondary nonlinearity occurs due to parasitic components on or in an input signal path. That is, during a switching period when the switch in opened (i.e., the transistor is turned off), source-drain conduction continues until the clock signal reaches or decreases below a threshold condition. For this reason, secondary nonlinearity occurs.

Thus, according to embodiments of the present invention, a transistor circuit capable of improving secondary nonlinear characteristics is disclosed.

Figure 3:
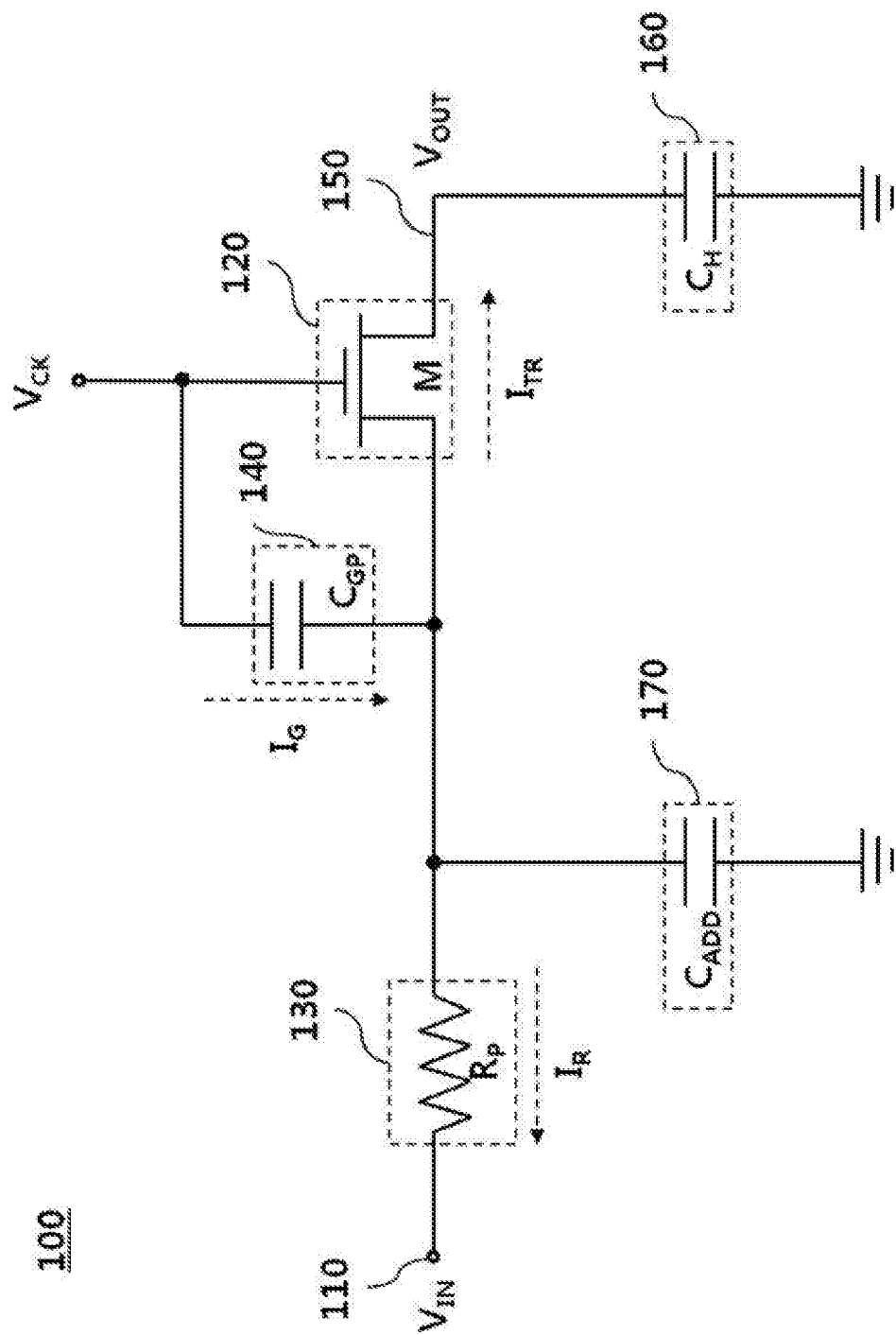
FIG. 3 is a diagram illustrating an exemplary transistor circuit according to embodiments of the present invention.

Hereinafter, a transistor circuit according to embodiments of the present invention will be described with reference to the accompanying drawings. FIG. 3 is a circuit diagram of an exemplary transistor circuit according to an embodiment of the present invention.

Referring to FIG. 3, an exemplary transistor circuit 100 according to various embodiments of the present invention includes an input terminal 110, a transistor 120 (M), a parasitic resistor 130 ($R_P$), a parasitic capacitor 140 ($C_{GP}$), an output line 150, an output capacitor 160 ($C_H$), and a dummy capacitor 170 ($C_{ADD}$).

An input signal $V_{IN}$ is supplied to the input terminal 110 and then transferred to the transistor 120 (M). The input signal $V_{IN}$ supplied to the input terminal 110 is at a predetermined voltage level. Since the input terminal 110 is connected to the source of the transistor 120 (M), the input signal $V_{IN}$ is applied to the source of the transistor 120 (M).

The transistor 120 (M) works as a switch. A clock signal $V_{CK}$ which is at a predetermined voltage level is applied to the gate of the transistor 120 (M). The source of the transistor 120 (M) is connected to the input terminal 110, and the drain of the transistor 120 (M) is connected to an output line 150. The transistor 120 (M) is an n-channel MOS (NMOS) transistor or a p-channel MOS (PMOS) transistor and functions as a switch in the present embodiments.

When the input signal $V_{IN}$ is applied to the input terminal 110 and the clock signal $V_{CK}$ is applied to the gate of the transistor 120 (M), a forward output current $I_{TR}$ may flow, depending on the states or values of the input signal $V_{IN}$ and the clock signal $V_{CK}$ and the characteristics of the transistor 120. That is, the current $I_{TR}$ may flow through the transistor 120 (M) toward the output line 150. Alternatively, in the case of the NMOS transistor, the switch is open when the clock signal $V_{CK}$ has a high logic level and is closed when the clock signal $V_{CK}$ has a low logic level. Conversely, in the case of the PMOS transistor, the switch is open when the clock signal $V_{CK}$ has a low logic level and is closed when the clock signal $V_{CK}$ has a high logic level. The forward output current $I_{TR}$ flows through the transistor 120 when the switch is open and the input signal $V_{IN}$ has a value above the threshold voltage of the NMOS transistor, or below the threshold voltage of the PMOS transistor.

The parasitic resistor 130 ($R_P$) is in a connection line between the input terminal 110 and the transistor 120 (M). When the input signal $V_{IN}$ is applied to the input terminal 110 and the clock signal $V_{CK}$ is applied to the gate of the transistor 120 (M), a first parasitic current $I_R$ may flow through the parasitic resistor 130 ($R_P$) or connection line. The first parasitic current is a reverse current that flows from the transistor 120 (M) toward the input terminal 110.

The parasitic capacitor 140 ($C_{GP}$) is formed between the input terminal 110 (or the corresponding connection line) and the gate of the transistor 120 (M) (or the signal line carrying the clock signal $V_{CK}$). Schematically, a first side or terminal of the parasitic capacitor 140 ($C_{GP}$) is connected to the connection line that is between the input terminal 110 and the source of the transistor 120 (M), and a second side or terminal of the parasitic capacitor 140 ($C_{GP}$) is connected to a clock signal input line that is, in turn, connected to the gate of the transistor 120 (M). In this case, when the input signal $V_{IN}$ is applied to the input terminal 110 and the clock signal $V_{CK}$ is applied to the gate of the transistor 120 (M), a second parasitic current $I_G$ may flow through the parasitic capacitor 140 ($C_{GP}$).

The output line 150 is a signal path that outputs an output signal $V_{OUT}$ from the transistor 120 (M). The output signal on the output line 150 may have a predetermined voltage level and may be applied to the output capacitor 160 ($C_H$). To this end, a first end of the output line 150 is connected to the drain of the transistor 120 (M), and a second end of the output line 120 is connected to the output capacitor 160 ($C_H$).

The output capacitor 160 ($C_H$) samples, filters, smoothes and/or stores an output voltage $V_{OUT}$ of the transistor, which is transferred through the output line 150. A first side or terminal of the output capacitor 160 ($C_H$) is connected to the output line 150. A second side or terminal (i.e., opposite or complementary to the first side or terminal) of the output capacitor 160 ($C_H$) is connected to a ground terminal or potential. The output capacitor 160 ($C_H$) discharges an amount of charge corresponding to an amount of the current $I_{TR}$ that flows through the transistor 120 (M).

The dummy capacitor 170 ($C_{ADD}$) reduces secondary nonlinearity of the transistor 120 (M), which is attributable to the parasitic components (e.g., the parasitic resistor $R_P$ and/or the parasitic capacitor $C_{GP}$) and the clock signal $V_{CK}$. The dummy capacitor 170 ($C_{ADD}$) is connected to the connection line that is between the input terminal 110 and the transistor 120 (M). That is, the dummy capacitor 170 ($C_{ADD}$) is connected to a line that connects the input terminal 110 and the source of the transistor 120 (M). Specifically, a first side or terminal of the dummy capacitor 170 ($C_{ADD}$) is connected to a line that connects the input terminal 110 and the source of the transistor 120 (M). At this point, the position at which the first side or terminal of the dummy capacitor 170 ($C_{ADD}$) is connected to the line that connects the input terminal 110 and the source of the transistor 120 (M) is spaced from the position at which the parasitic capacitor 140 ($C_{GP}$) is connected. In other words, the first side or terminal of the dummy capacitor 170 ($C_{ADD}$) is connected to a line that connects the input terminal 110 and the second side or terminal of the parasitic capacitor 140 ($C_{GP}$). The second terminal of the second capacitor is connected to the ground terminal.

The dummy capacitor 170 ($C_{ADD}$) reduces alternating current impedance at a node (i.e., the connection line between the input terminal 110 and the transistor 120), thereby distributing, smoothing or filtering the peak (e.g., reducing the clock feedthrough) that occurs when the transistor 120 (M) is turned off. Therefore, the first parasitic current $I_R$ that flows through the parasitic resistor 130 $R_P$ and the output current $I_{TR}$ that flows through the transistor 120 (M) decrease, thereby reducing the effects that the input signal $V_{IN}$ and the clock signal $V_{CK}$ have on the output signal as the clock signal $V_{CK}$ transitions while turning off the transistor 120. As a result, secondary nonlinearity is improved.

The transistor circuit 100 according to embodiments of the present invention improves the secondary nonlinearity using a capacitor. The capacitance of the capacitor (e.g., $C_{ADD}$) may be determined by taking into account the parasitic components (i.e., the parasitic resistor 130 [$R_P$] or the parasitic resistance of the connection line between input signal $V_{IN}$ and the transistor 120, and the parasitic capacitor 140 [$C_{GP}$], or the parasitic capacitance between [i] the gate of the transistor 120 and/or the signal line providing the clock signal $V_{CK}$ and [ii] the source of the transistor 120 and/or the connection line between input signal VIN and the transistor 120), and the capacitor (e.g., $C_{ADD}$) is included in the transistor circuit 100. Therefore, the transistor circuit 100 may be difficult to design and may occupy a relatively large area (e.g., in comparison with an otherwise identical transistor circuit that does not include the dummy capacitor $C_{ADD}$).

Figure 4:
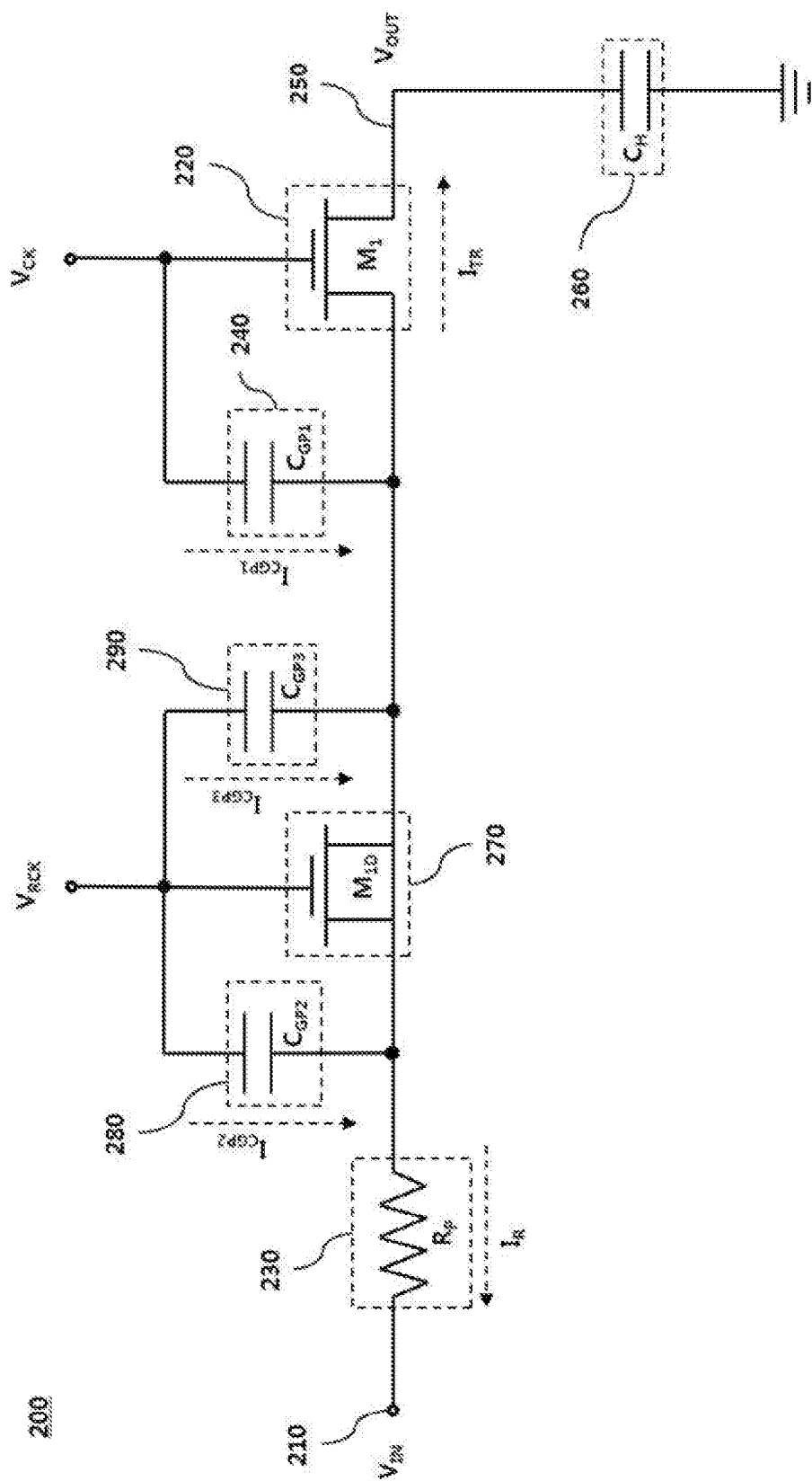
FIGS. 4 and 5 are diagrams illustrating an exemplary transistor circuit according to further embodiments of the present invention.
Figure 5:
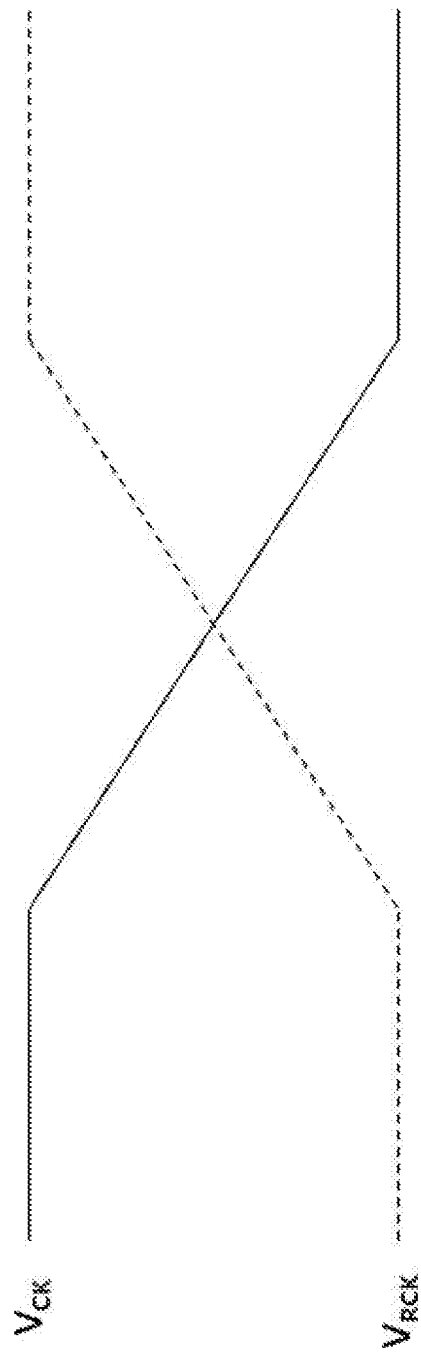

Hereinafter, a transistor circuit according to other embodiments of the present invention will be described with reference to the accompanying drawings. FIGS. 4 and 5 are diagrams illustrating an exemplary transistor circuit according to the other embodiments of the present invention.

Referring to FIG. 4, a transistor circuit 200 according to embodiments of the present invention includes an input terminal 210, a transistor 220 ($M_1$), a parasitic resistor 230 ($R_P$), a first parasitic capacitor 240 ($C_{GP1}$), an output line 250, an output capacitor 260 ($C_H$), a dummy transistor 270 ($M_{1D}$) a second parasitic capacitor 280 ($C_{GP2}$), and a third parasitic capacitor 290 ($C_{GP3}$). The dummy transistor 270 ($M_{1D}$) in the transistor circuit 200 reduces parasitic components that may affect signals on the output signal line 250.

An input signal $V_{IN}$ is applied to the input terminal 210. The input signal $V_{IN}$ is transferred to the transistor 220 ($M_1$) via the input terminal 210. The input signal $V_{IN}$ applied to the input terminal 210 may be at a predetermined voltage level. The input terminal 210 is connected to the source of the transistor 220 ($M_1$), so that the input signal $V_{IN}$ is applied to the source of the transistor 220 ($M_1$).

The transistor 220 ($M_1$) works as a switch. The gate of the transistor 220 ($M_1$) receives a clock signal $V_{CK}$. The source of the transistor ($M_1$) is connected to the input terminal 210. The drain of the transistor 220 ($M_1$) is connected to a first end of the output line 250. The transistor 220 ($M_1$) is an NMOS or PMOS transistor and serves as a switch in the circuit.

As the input signal $V_{IN}$ is applied to the input terminal 210 and the clock signal $V_{CK}$ is applied to the gate of the transistor 220 ($M_1$), a forward output current $I_{TR}$ may flow through the transistor 220 ($M_1$) to the output line 250, as described previously.

The parasitic resistor 230 ($R_P$) is a parasitic component (e.g., in the connection line) between the input terminal 210 and the transistor 220 ($M_1$). Specifically, the parasitic resistor 230 ($R_P$) is between the input terminal 210 and the source of the transistor 220 ($M_1$). As the input signal $V_{IN}$ is applied to the input terminal 210 and the clock signal $V_{CK}$ is applied to the gate of the transistor 220 ($M_1$), a parasitic current may flow in the reverse direction, i.e., from the transistor 220 ($M_1$) to the input terminal 210, as described previously.

The first parasitic capacitor 240 ($C_{GP1}$) is formed between (1) the connection line between the dummy transistor 270 ($M_{1D}$) and the transistor 220 ($M_1$) (and/or the source of the transistor 220) and (2) the signal line carrying the clock signal $V_{CK}$ (and/or the gate of the transistor 220). Schematically, a first terminal of the first parasitic capacitor 240 ($C_{GP1}$) is connected to the connection line that connects the drain of the dummy transistor 270 ($M_{1D}$) and the source of the transistor 220 ($M_1$), and a second terminal of the first parasitic capacitor 240 ($C_{GP1}$) is connected to a clock signal input line connected to the gate of the transistor 220 ($M_1$).

Under certain conditions, when the input signal $V_{IN}$ is applied to the input terminal 210 and the clock signal $V_{CK}$ is applied to the gate of the transistor 220 ($M_1$), a first parasitic current $I_{CGP1}$ may flow through the first parasitic capacitor 240 ($C_{GP1}$).

The output signal $V_{OUT}$ of the transistor 220 ($M_1$) is output to the output line 250. The output line 250 transfers the output signal $V_{OUT}$ that may be at a predetermined voltage to the output capacitor 260 ($C_H$). To this end, the output line 250 is connected to the drain of the transistor 220 ($M_1$). A second end of the output line 250 is connected to the output capacitor 260 ($C_H$).

The output capacitor 260 ($C_H$) may be charged by the voltage of the output signal ($V_{OUT}$) on the output line 250. The first terminal of the output capacitor 260 ($C_H$) is connected to the output line 250. The second terminal of the output capacitor 260 (CH) is connected to a ground terminal. The output capacitor 260 ($C_H$) may be discharged or charged at a rate related to the output current $I_{TR}$ that flows through the transistor 220 ($M_1$).

The dummy transistor 270 ($M_{1D}$) is between the input terminal 210 and the transistor 220 ($M_1$). An inverted clock signal $V_{RCK}$ that is complementary to the clock signal $V_{CK}$ is input to the gate of the dummy transistor 270 ($M_{1D}$). The source of the dummy transistor 270 ($M_{1D}$) is connected to a conductive line connected to the input terminal 210, and the drain of the dummy transistor 270 ($M_{1D}$) is connected to a conductive line connected to the source of the transistor 220 ($M_1$). The dummy transistor 270 ($M_{1D}$) typically is an NMOS or PMOS transistor.

The second parasitic capacitor 280 ($C_{GP2}$) is formed between (1) the input terminal 210 and/or the connection line that connects the input terminal 210 to the dummy transistor 270 and (2) the dummy transistor 270 ($M_{1D}$) and/or the signal line carrying the inverted clock signal $V_{RCK}$. Schematically, a first terminal of the second parasitic capacitor 280 ($C_{1D}$) is connected to the conductive line that connects the input terminal 210 and the source of the dummy transistor 270 ($M_{1D}$), and a second terminal of the second parasitic capacitor 280 ($C_{GP2}$) is connected to an inverted clock signal input line connected to the gate of the dummy transistor 270 ($M_{1D}$).

As explained above, under certain conditions, when the input signal $V_{IN}$ is applied to the input terminal 210 and the inverted clock signal $V_{RCK}$ is applied to the gate of the dummy transistor 270 ($M_{1D}$), a second parasitic current $I_{CGP2}$ may flow through the second parasitic capacitor 280 ($C_{GP2}$).

The third parasitic capacitor 290 ($C_{GP3}$) is formed between the dummy transistor 270 ($M_{1D}$) and the transistor 220 ($M_1$). Schematically, a first terminal of the third parasitic capacitor 290 ($C_{GP3}$) is connected to the conductive line that connects the drain of the dummy transistor 270 ($M_{1D}$) and the source of the transistor 220 ($M_1$), and a second terminal of the third parasitic capacitor 290 ($C_{GP3}$) is connected to the inverted clock signal input line connected to the gate of the dummy transistor 270 ($M_{1D}$).

In this case, when the input signal $V_{IN}$ is applied to the input terminal 210 and the inverted clock signal $V_{RCK}$ is applied to the gate of the dummy transistor 270 ($M_{1D}$), a third parasitic current $I_{CGP3}$ may flow through the third parasitic capacitor 290 ($C_{GP3}$).

Thus, in the transistor circuit 200, the inverted clock signal $V_{RCK}$ (which is complementary to the clock signal $V_{CK}$) is applied to the gate of the dummy transistor 270 ($M_{1D}$), and clock feedthrough in the main transistor 220 ($M_1$) can be minimized by adjusting the timing of the clock and inverted clock signals. That is, the transistor circuit 200 can reduce the occurrence of nonlinearity by absorbing the first parasitic current $I_{CGP1}$ due to clock feedthrough using the second parasitic current $I_{CGP2}$ that flows through the second parasitic capacitor 280 ($C_{GP2}$) and the third parasitic current $I_{CGP3}$ that flows through the third parasitic capacitor 290 ($C_{GP3}$).

As described above, with the dummy capacitor or the dummy transistor between the input terminal and the transistor, the transistor circuit can minimize the influence of parasitic components in a signal line.

In addition, with the dummy capacitor or the dummy transistor between the input terminal and the transistor, the transistor circuit can improve secondary nonlinearity induced by the parasitic components and the clock signal.

When the transistor circuit is utilized in an analog circuit including a switched-capacitor circuit, it is possible to improve the performance of the analog circuit. When the transistor circuit is utilized in multi-channel and/or multi-chip products such as a sensor, it is possible to reduce a difference between channels or between chips.

When the transistor circuit is utilized in products such as a sensor including multiple channels or multiple chips, it is not necessary to apply a layout technique, such as a clock tree scheme, to the products to equalize the parasitic components on or in the signal lines. For this reason, the transistor circuit can be usefully utilized in a variety of application circuits.

The above detailed description is to illustrate the present invention. In addition, the foregoing is a description of various embodiments of the present invention, and the present invention can be used in various other combinations, modifications and environments. That is, the various embodiments can be changed or modified within the scope of the concept of the present invention disclosed herein, the scope equivalent to the disclosed contents, and/or the scope of the technical spirit or knowledge in the art to which the present invention pertains. The above-described embodiments implement the technical spirit of the present invention, and various changes thereof are possible according to specific applications and usages of the present invention. Accordingly, it should be noted that the detailed description is not intended to limit the invention to the disclosed embodiments.

What is claimed is:

1. A transistor circuit comprising:
   an input terminal configured to receive an input signal;
   a transistor having a gate configured to receive a clock signal;
   a line between the input terminal and the transistor, the line including a parasitic resistor between the input terminal and a dummy transistor:
   a first parasitic capacitor formed between (i) the input terminal or the line and (ii) a signal line providing the clock signal;
   the dummy transistor having a gate configured to receive an inverted clock signal, the dummy transistor being connected between the input terminal and the transistor;
   a second parasitic capacitor connected to the input terminal and a signal line providing the inverted clock signal: and
   a third parasitic capacitor connected to the transistor and the signal line providing the inverted clock signal, wherein
   the dummy transistor has a source connected to the input terminal and a drain connected to a source of the transistor:
   a first terminal of the second parasitic capacitor is connected to a line that connects the input terminal and the source of the dummy transistor, and a second terminal of the second parasitic capacitor is connected to the signal line providing the inverted clock signal: and
   a first terminal of the third parasitic capacitor is connected to a line that is connected to the source of the transistor and the drain of the dummy transistor, and a second terminal of the third parasitic capacitor is connected to the signal line providing the inverted clock signal.

2. The transistor circuit according to claim 1, further comprising:
   an output line connected to a drain of the transistor; and
   an output capacitor connected to the output line.

3. The transistor circuit according to claim 1, wherein when the input signal is applied to the input terminal and the inverted clock signal is applied to the dummy transistor, a second parasitic current flows through the second parasitic capacitor and the third parasitic capacitor, reducing a first parasitic current that flows through the first parasitic capacitor.

4. An electronic circuit comprising a transistor circuit working as a switch, the transistor circuit comprising:
   an input terminal configured to receive an input signal;
   a transistor having a gate configured to receive a clock signal;
   a connection line between the input terminal and the transistor, the connection line having a parasitic resistor between the input terminal and a dummy transistor;
   a first parasitic capacitor between the input terminal and the transistor;
   a dummy transistor having a gate configured to receive an inverted clock signal, the dummy transistor being connected to the input terminal and to the transistor;
   a second parasitic capacitor between the input terminal and the dummy transistor; and
   a third parasitic capacitor connected to the transistor and the dummy transistor a signal line providing the inverted clock signal, wherein
   the dummy transistor has a source connected to the input terminal and a drain connected to a source of the transistor;
   a first terminal of the second parasitic capacitor is connected to a line that connects the input terminal and the source of the dummy transistor, and a second terminal of the second parasitic capacitor is connected to the signal line providing the inverted clock signal; and a first terminal of the third parasitic capacitor is connected to a line that is connected to the source of the transistor and the drain of the dummy transistor, and a second terminal of the third parasitic capacitor is connected to the signal line providing the inverted clock signal.

* * * * *